(12) United States Patent
Zhang et al.

(10) Patent No.: US 8,674,641 B2
(45) Date of Patent: Mar. 18, 2014

(54) SYSTEM AND METHOD FOR REGULATING MOTOR ROTATION SPEED

(75) Inventors: Zhihong Zhang, ShangHai (CN); XuJiang Huang, ShangHai (CN)

(73) Assignee: Shanghai SIM-BCD Semiconductor Manufacturing Limited, Shanghai (CN)

( * ) Notice: Subject to any disclaimer, the term of this patent is extended or adjusted under 35 U.S.C. 154(b) by 375 days.

(21) Appl. No.: 12/880,735

(22) Filed: Sep. 13, 2010

(65) Prior Publication Data

US 2011/0299247 A1 Dec. 8, 2011

(30) Foreign Application Priority Data

Jun. 8, 2010 (CN) .......................... 2010 1 0195275

(51) Int. Cl.
*H05K 7/20* (2006.01)

(52) U.S. Cl.
USPC ............................ 318/471; 318/472; 318/473

(58) Field of Classification Search
USPC ......................................... 318/471, 472, 473
See application file for complete search history.

(56) References Cited

U.S. PATENT DOCUMENTS

| 6,076,488 A * | 6/2000 | Yamagishi ................. 123/41.12 |
| 6,172,611 B1 * | 1/2001 | Hussain et al. ............... 340/584 |
| 2003/0173922 A1 * | 9/2003 | Pelonis ......................... 318/439 |
| 2003/0236594 A1 * | 12/2003 | Frankel et al. ................. 700/300 |
| 2004/0178759 A1 * | 9/2004 | Nakamura et al. ............ 318/471 |
| 2006/0290310 A1 * | 12/2006 | Sumiya et al. ................ 318/471 |
| 2007/0096665 A1 * | 5/2007 | Ku et al. .......................... 318/66 |
| 2009/0167228 A1 * | 7/2009 | Chung et al. .................. 318/455 |

* cited by examiner

*Primary Examiner* — Shawki Ismail
*Assistant Examiner* — Bryan Gordon

(57) ABSTRACT

The present invention relates to a system and method controlling motor rotation speed and provides a cooling system and method configured to control a temperature associated with an integrated circuit. The cooling system includes a brushless motor, a temperature monitoring input, a clock input, and a motor controller. The motor controller is configured to control the rotational speed of the motor using at least a speed control method by comparing the environmental temperature signal to a predetermined threshold: if the environmental temperature signal is less than the predetermined threshold T1 or higher than T2, controlling the rotational speed of the motor uses the speed control method and only one of the environmental temperature signal and the clock signal; and if the environmental temperature signal is greater than the predetermined threshold T1 and less than T2, controlling the rotational speed of the motor uses the speed control method and both of the environmental temperature signal and the clock signal.

19 Claims, 12 Drawing Sheets

SYSTEM AND METHOD FOR REGULATING MOTOR ROTATION SPEED

CROSS-REFERENCE TO RELATED APPLICATIONS

This application claims the benefit of Chinese patent application No. 201010195275.7, filed on Jun. 8, 2010, and entitled "A control pulse generating circuit used to regulate the rotational speed of a brushless direct current motor".

FIELD OF THE INVENTION

The present invention generally relates to systems and methods controlling motor rotation speed and, more particularly, to systems and methods for controlling brushless direct current motor rotation speed.

BACKGROUND OF THE INVENTION

Single-phase speed regulating brushless direct current motor has advantages on energy efficiency and noise control, and has a wide range of application and, particularly, applications and environments including electronics, where energy efficiency and noise control are often of paramount consideration. In particular, these motors are often employed with cooling fans in consumer electronics equipment, such as for computer hard drives, data storage devices, video game consoles, CD/DVD players, and the like, which generally dissipate a lot power and generate a lot of heat while in operation.

Among the existing technologies regularly utilized in controlling the rotation speed of brushless direct current motor for cooling fans, there are three main methods for regulating the motor rotation speed: fixed speed; variable speed controlled by a clock signal, such as, a pulse width modulation ("PWM") signal; and variable speed controlled by a temperature feedback.

Fixed speed fans are not able to vary the rotation speed, which is energy inefficient and cause more noise. For example, in a typical computer housing, there is a fixed speed cooling fan that operates continuously once the computer is turned on. The fixed speed cooling fan operates at its maximum power and does not meet the trend towards low-power consuming devices.

Variable speed fans are controlled by a clock signal, for example, a PWM signal and, generally have a fan speed that is near linear with the duty cycle of the PWM signal. For example, a device can use a PWM signal with specific duty cycle setup according to different operation mode to control the cooling fan. Therefore the cooling fan can work at low speed with respect to low work-load operation mode. Such designs are more energy efficiency and reduce noise; however, they may not offer as much efficiency and flexibility as may be desired.

Variable speed fans are controlled by a temperature feedback such as, a detected temperature of a component such as a power supply of an electric device, a processor, a memory, a hard disk drive, and the like. This temperature measurement is used to determine the rotational speed of the motor coupled to a cooling fan. This method provides more flexibility and reduce power consumed by the fan and motor and significantly reduces the noise generated by operation of the fan and motor when the detected temperature is relatively low. Fan and motor control based on temperature alone, however, presents a number of drawbacks because the fan speed control is reactive, rather than proactive. In other words, adjusting fan speed based on temperature only adjusts the fan speed after the temperature has already increased. When power dissipation is increased in a component, it takes time for the thermal information being transferred from the heat generating device to reach a temperature sensor. In this situation, desired cooling function may not be provided before the device reaches a still higher temperature or even reaches an undesirable temperature. In addition, other components in a system may also be heating up and the total heating of the system may not be linear with the temperature of the component where temperature is detected.

Therefore, it would be desirable to have a system and method for regulating the motor rotation speeds with a more robust, energy-efficient, flexible, yet not overly-complex, method of control.

SUMMARY OF INVENTION

The present invention overcomes the aforementioned drawbacks by providing a motor rotation speed control system that regulates the motor rotation speed by using both the environmental temperature and a clock signal, such that the motor rotation speed can be regulated under various functions corresponding to different circumstance.

In accordance with one aspect of the present invention, a cooling system configured to control a temperature associated with an integrated circuit is provided. The cooling system includes a brushless motor, a temperature monitoring input, a clock input, and a motor controller. The brushless motor is configured to drive a cooling device based on a rotational speed of the motor. The temperature monitoring input is configured to receive an environmental temperature indicating a temperature associated with the integrated circuit. The clock input is configured to receive a clock signal having a predetermined duty cycle. The motor controller is configured to receive the environmental temperature signal from the temperature monitoring input and the clock signal input and coupled to the brushless motor to control the rotational speed of the motor. The motor controller compares the environmental temperature signal to a predetermined threshold T1 and T2: if the environmental temperature signal is less than the predetermined threshold T1 or higher than T2, controlling the rotational speed of the motor uses the speed control method and only one of the environmental temperature signal and the clock signal; and if the environmental temperature signal is between the predetermined threshold T1 and T2, controlling the rotational speed of the motor uses the speed control method and both of the environmental temperature signal and the clock signal.

More specifically, the motor controller includes a pulse generating circuit, which includes a temperature signal processing circuit, a clock signal processing circuit, a triangular wave generating circuit, and a control pulse output circuit. The temperature signal processing circuit is configured to receive the environmental temperature signal, and output an electric current signal, which has a relationship with the environmental temperature signal. The clock signal processing circuit is configured to receive the clock signal and the electric current signal (and an input pulse signal), and generate a direct current voltage signal. The triangular wave generating circuit is configured to generate a triangular wave signal. The control pulse output circuit configured to process the triangular wave signal and the direct current voltage signal, and deliver a control pulse signal to control the rotational speed of the brushless motor.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Figure 1:
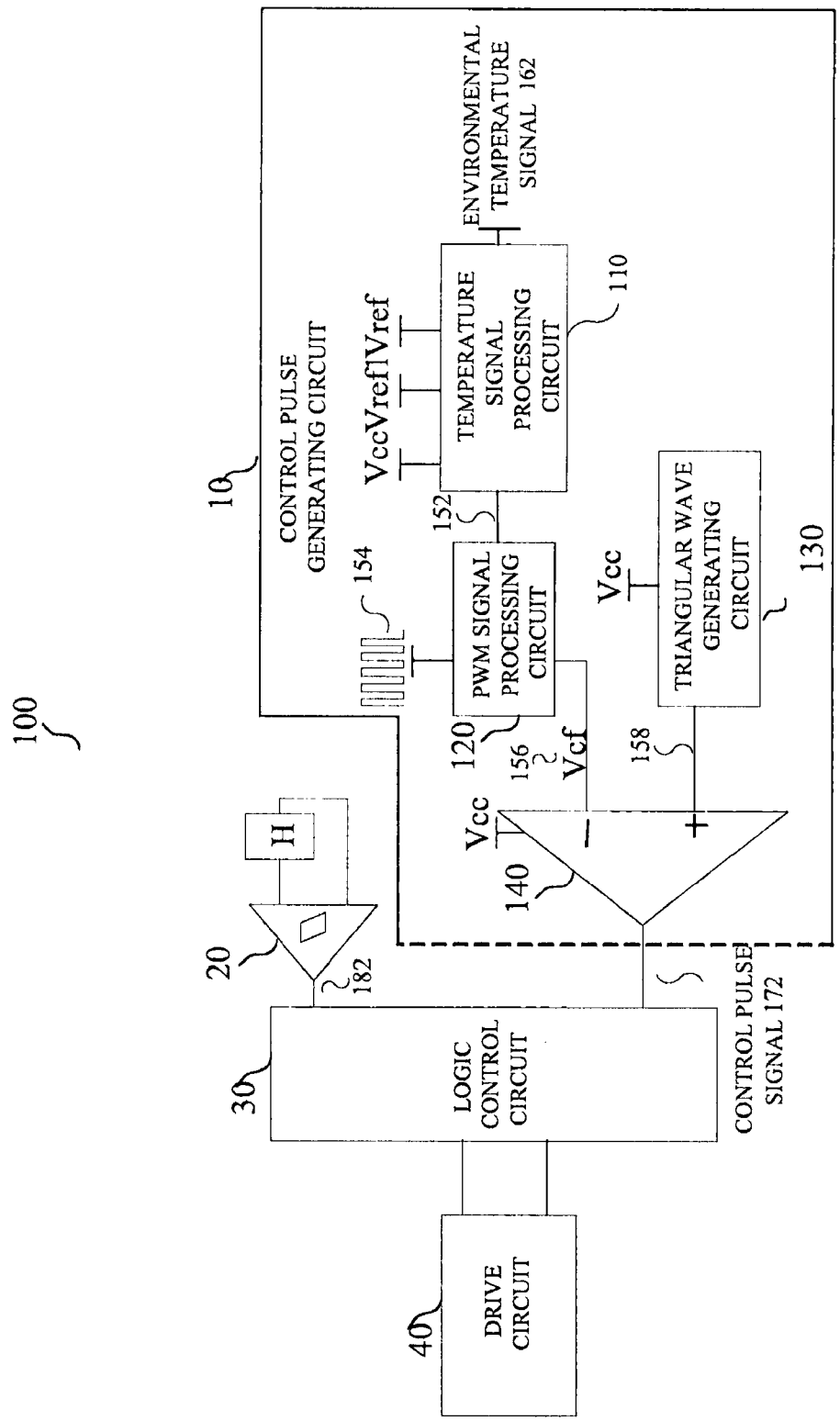
FIG. 1 is a circuit diagram showing a motor control system 100 that is configured to regulate a rotation speed of a brushless direct current motor, in accordance with the present invention.

FIG. 1 is a circuit diagram showing a brushless motor control system 100 that is configured to regulate a rotation speed of a brushless direct current motor, in accordance with the present invention. The system 100 includes a control pulse generating circuit 10, a hall signal generating circuit 20, a logic control circuit 30, and a drive circuit 40.

In FIG. 1, the control pulse generating circuit 10 can be configured to generate a control pulse signal 172. The duty cycle of the control pulse signal 172 has a linear relationship with both the duty cycle of a PWM input signal 154 and an environmental temperature signal 162. The Hall signal generating circuit 20 can be configured to generate a direction reversal control signal 182 when a generator rotor passes through a Hall component. The logic control circuit 30 can be configured to receive the direction reversal control signal output from the Hall signal generating circuit 20 and the control pulse signal output from the control pulse generating circuit 10, process and output these signals to the drive circuit 40. The drive circuit 40 is configured to control and regulate rotation speed of the brushless direct current motor by using the received the direction reversal control signal and the control pulse signal from circuit 30.

More specifically, as shown in FIG. 1, the control pulse generating circuit 10 includes a temperature signal processing circuit 110, a PWM signal processing circuit 120, a triangular wave generating circuit 130, and a control pulse output circuit 140. The temperature signal processing circuit 110 can be configured to convert a detected environmental temperature signal 162 into an electric current signal 152. This electric current signal 152 has a linear relationship with the environmental temperature and can be output to the PWM signal processing circuit 120. The PWM signal processing circuit 120 can be configured to receive a PWM input signal 154 and the electric current signal 152 output by the temperature signal processing circuit 110, and convert the PWM input signal 154 into a direct current voltage signal Vcf 156, which has a linear relationship with both the duty cycle of the PWM input signal 154 and the environmental temperature signal 162. The direct current voltage signal Vcf 156 can be output to a negative input terminal of the control pulse output circuit 140. The triangular wave generating circuit 130 can be configured to generate a triangular wave signal 158, which can be output to a positive input terminal of the control pulse output circuit 140. The control pulse output circuit 140 can be configured to generate a control pulse signal 172 by using the direct voltage signal Vcf 156 received on the negative input terminal and the triangular wave signal 158 received on the positive input terminal. The duty cycle of the control pulse signal 172 has a linear relationship with both the duty cycle of the PWM input signal 154 and the environmental temperature signal 162.

Figure 2:
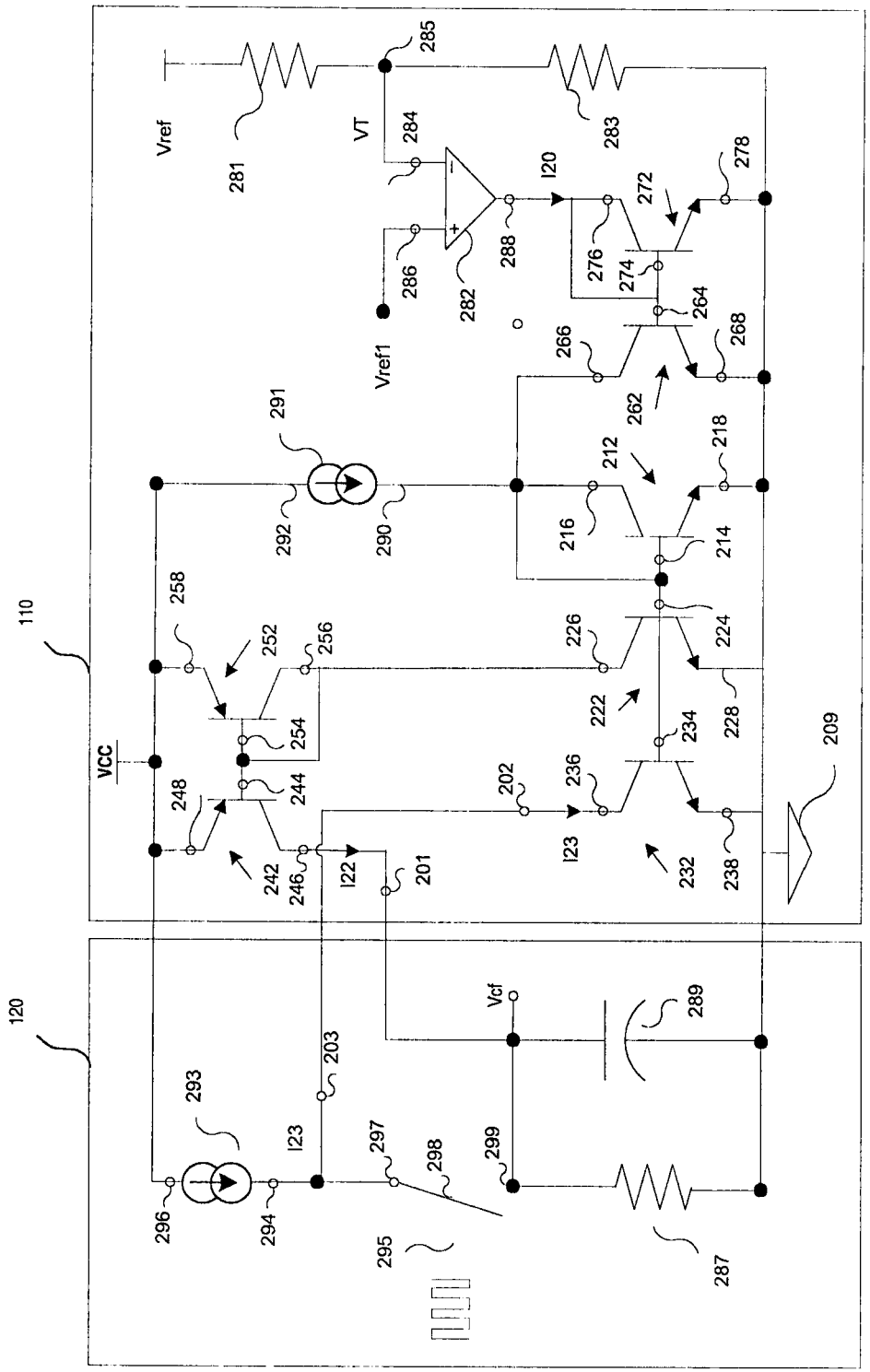
FIG. 2 is a circuit diagram showing the temperature signal processing circuit and the PWM signal processing circuit of FIG. 1

FIG. 2 is a circuit diagram showing a first configuration of the temperature signal processing circuit 110 and the PWM signal processing circuit 120 of FIG. 1. As shown in FIG. 2, the temperature signal processing circuit 110 includes a first transistor 212, a second transistor 222, a third transistor 232, a fourth transistor 242, a fifth transistor 252, a sixth transistor 262, a seventh transistor 272, a first resistor 281, a comparator 282, a temperature sensitive resistor 283, and a first electric current source 291.

As shown in FIG. 2, the first resistor 281 is connected to a first reference voltage Vref. a negative input terminal 284 of the first comparator 282 is connected to a shared terminal 285 of the first resistor 281 and the temperature sensitive resistor 283, a positive input terminal 286 of the first comparator 282 is connected to a second reference voltage Vref1, and an output terminal 288 of the first comparator 282 is connected to a collector electrode 276 of the seventh transistor 272. A base electrode 274 of the seventh transistor 272 is connected to a collector electrode 276 of the seventh transistor 272. A base electrode 274 of the seventh transistor 272 is connected to a base electrode 264 of the sixth transistor 262. An emitter electrode 278 of the seventh transistor 272 and an emitter electrode 268 of the sixth transistor 262 are both connected to a ground 209. A collector electrode 266 of the sixth transistor 262 is connected to a negative terminal 290 of the first electric current source 291, a collector electrode 216, and a base electrode 214 of the first transistor 212. A positive terminal 292 of the first electric current source 291 is connected to a power supply VCC. Respective base electrodes 214, 224, 234 of the first transistor 212, the second transistor 222, the third transistor 232 are connected to each other. Respective emitter electrodes 218, 228, 238 of the first transistor 212, the second transistor 222, the third transistor 232 are connected to the ground 209. A collector electrode 226 of the second transistor 222 is connected to a collector electrode 256 of the fifth transistor 252. The collector electrode 256 and a base electrode 254 of the fifth transistor 252 are short circuited and connected to a base electrode 244 of the fourth transistor 242. An emitter electrode 258 of the fifth transistor 252 and an emitter electrode 248 of the fourth emitter 242 are both connected to the power supply Vcc. A collector electrode 246 of the fourth transistor 242 is a first output terminal 201 of the temperature signal processing circuit 110, which outputs an electric current I22 to the PWM signal processing circuit 120. A collector electrode 236 of the third transistor 232 is a second output terminal 202 of the temperature signal processing circuit 110, which outputs an electric current I23 to the PWM signal processing unit 120.

A voltage VT of the terminal 285 which is the input voltage of the negative terminal 284 of the comparator 282 can be calculated by:

$$VT = Vref \times \frac{RT}{R1 + RT}; \quad \text{Eqn. (1)}$$

where RT is the resistance value of the temperature sensitive resistor 283 and R1 is the resistance value of the first resistor 281. The temperature sensitive resistor 283 is used to detect the environmental temperature. The resistance value RT of the temperature sensitive resistor 283 can change following the environmental temperature changes, which results in the voltage VT changes, as indicated by Eqn. (1). Further, as indicated by Eqn. (1), the voltage VT and the resistance value RT of the temperature sensitive resistor 283 are linearly related to each other. Since the resistance value RT of the temperature sensitive resistor 283 and the environmental temperature have a linear relationship, the voltage VT is linearly related to the environmental temperature.

As shown in FIG. 2, the first comparator 282 can compare the second reference voltage Vref1 with the voltage VT and output an electric current I20. The electric current I20 can be calculated by:

$$I20 = (Vref1 - VT) \times gm = \left(Vref1 - Vref \times \frac{RT}{R1 + RT}\right) \times gm; \quad \text{Eqn. (2)}$$

where gm is a gm transconductor value of the first comparator 282. As indicated by Eqn. (2), the electric current I20 is linearly related to RT, and therefore is linearly related to the environmental temperature.

As shown in FIG. 2, an electric current that passes through the first transistor 212 is directly proportional to the current difference between the first electric current source 291 and electric current I20. Further, the first transistor 212 and the second transistor 222 constitute a current mirror, and the fourth transistor 242 and the fifth transistor 252 constitute a current mirror. The electric current at the emitter electrode 258 of the fifth transistor 252 is proportional to the electric current of the first electric current source 291, hence the electric current I22 is linearly related to the environmental temperature. The electric current I22 is also the output electric current signal of the temperature signal processing circuit 110. The collector electrode 236 of the third transistor 232 can output the electric current I23, and the direction of the electric current I23 is the opposite to the direction of the electric current I22. The electric current I22 and I23 can be calculated by:

$$I22 = I21 - I20 = I21 - \left(Vref1 - Vref \times \frac{RT}{R1 \times RT}\right) \times gm; \quad \text{Eqn. (3)}$$

and $$I23 = M \times \left[I21 - \left(Vref1 - Vref \times \frac{RT}{R1 \times RT}\right) \times gm\right]; \quad \text{Eqn. (4)}$$

where M is the area ratio between the respective emitter electrode 238 and 218 of the third transistor 232 and the first transistor 212.

Therefore, the temperature signal processing circuit 110 is used to convert a detected environmental temperature signal into a current signal I22 and I23. The current signal I22, I23 has a near linear relationship with the environmental temperature and is output to the PWM signal processing circuit 120.

In FIG. 2, the PWM signal processing circuit 120 includes a second current source 293, a controlled switch 295, a second resistor 287, and a capacitor 289.

The positive terminal 296 of the second current source 293 is connected to the power supply Vcc, and the negative terminal 294 of the second current source 293 is connected to the normally closed terminal 297 of the controlled switch 295 and the collector electrode 236 of the third transistor 232 of the temperature signal processing circuit 110, such that the negative terminal 294 can receive the current I23 from the second output terminal 202 of the temperature signal processing circuit 110. The control terminal 298 of the controlled switch 295 can receive the PWM signal, and the normally open terminal 299 of the controlled switch 295 is connected to the ground 209 through the second resistor 287. The capacitor 289 is parallel connected to the second resistor 287. The normally open terminal 299 of the controlled switch 295 is connected to the collector electrode 246 of the fourth transistor 242 of the temperature signal processing circuit 110, such that the terminal 299 can receive the current I22 from the first output terminal 201 of the temperature signal processing circuit 110. Further the normally open terminal 299 is also an output terminal 204 of the PWM signal processing circuit 120, which can output a direct current voltage signal Vcf to the control pulse output circuit 140, as shown in FIG. 1.

As shown in FIG. 2, the direct current voltage signal Vcf from the PWM signal processing circuit 120 is the voltage between the two terminals of the capacitor 289. When the PWM input signal has a low electric level, the controlled switch 295 is turn on, where the terminal 297 and the terminal 299 are connected. In this situation, the current difference between the second current source 293 and the current I23, the current I22 charge the capacitor 289. When the PWM input signal has a high electric level, the controlled switch 295 is turn off, where the terminal 297 and the terminal 299 are disconnected, and the capacitor 289 can discharge through the second resistor 287. Therefore, the voltage at the two terminals of the capacitor 289 can change following the duty cycle of the PWM input signal. Further, the current I22 and I23 from the temperature signal processing circuit 110 can flow into the capacitor 289, such that the voltage at the two terminals of the first capacitor 289 can also change following the changes of the currents I22 and I23. Hence, the direct current voltage signal Vcf output from the PWM signal processing circuit 120 has a near linear relationship with both the duty cycle of the PWM input signal and the environmental temperature.

Figure 3:
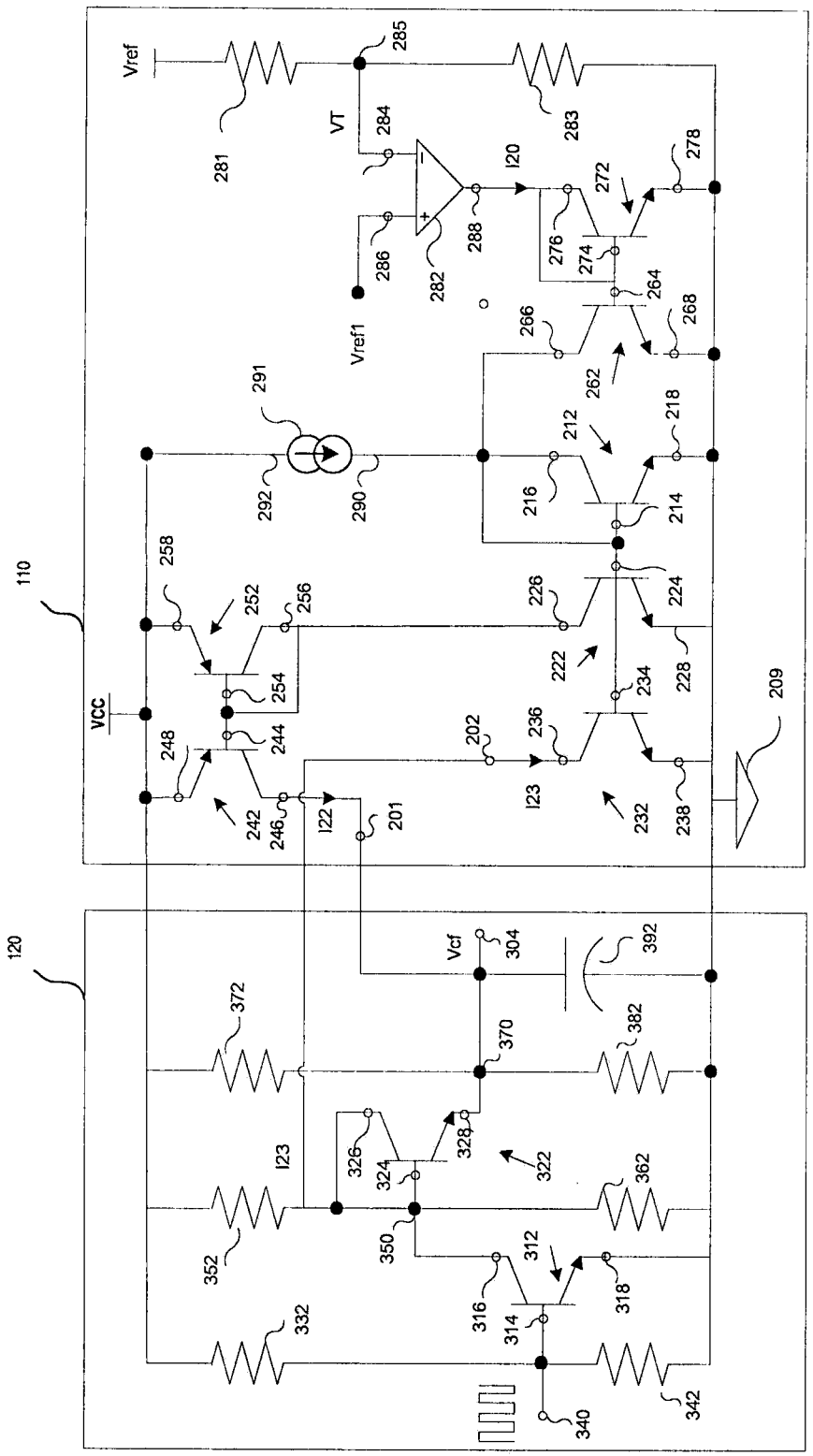
FIG. 3 is a circuit diagram showing a another configuration of the temperature signal processing circuit and the PWM signal processing circuit of FIG. 1.

FIG. 3 is a circuit diagram showing another configuration of the temperature signal processing circuit 110 and the PWM signal processing circuit 120 of FIG. 1, in accordance with the first configuration of the present invention. The overall structure, functions and operations of the temperature signal processing circuit 110 in FIG. 3 are essentially the same as those in FIG. 2, and a description thereof similar components and function will be omitted.

As shown in FIG. 3, the PWM signal processing circuit 120 includes: an eighth transistor 312, a ninth transistor 322, a third resistor 332, a fourth resistor 342, a fifth resistor 352, a sixth resistor 362, a seventh resistor 372, an eighth resistor 382, and a second capacitor 392. In FIG. 3, the third resistor 332 and the fourth resistor 342 are series connected, the fifth resistor 352 and the sixth resistor 362 are series connected, the seventh resistor 372 and the eighth resistor 382 are series connected, and these three pairs of series connected resistors are connected between the power supply Vcc and the ground 209. The shared terminal 340 of the third resistor 332 and the fourth resistor 342 can receive PWM input signals, and the shared terminal is connected to a base electrode 314 of the eighth transistor 312. A collector electrode 316 of the eighth transistor 312 is connected to a base electrode 324 of the ninth transistor 322, and an emitter electrode 318 of the eighth transistor 312 is connected to the ground 209. A collector electrode 326 and a base electrode 324 of the ninth transistor 322 are short circuited to each other and both are connected to a shared terminal 350 of the fifth resistor 352 and the sixth resistor 362. An emitter electrode 328 of the ninth transistor 322 is connected to a shared terminal 370 of the seventh resistor 372 and the eighth resistor 382. The second capacitor 392 is parallel connected to the two terminals of the eighth resistor 382. The shared terminal 370 of the seventh resistor 372 and the eighth resistor 382 is also an output terminal 304 which can output the voltage signal Vcf from the PWM signal processing circuit 120 to the control pulse output circuit 140.

The difference between the PWM signal processing circuit 120 shown in FIG. 3 and FIG. 2 lies in: the fifth resistor 352 and sixth resistor 362 in FIG. 3 replace the second current source 293 in FIG. 2; the third resistor 332 and the fourth resistor 342, eighth transistor 312, and the ninth transistor 322 in FIG. 3 replace the controlled switch 295 in FIG. 2; the seventh resistor 372 and the eighth resistor 382 in FIG. 3 replace the second resistor 287; and the collector electrode 326 of the ninth transistor 322 is connected to the shared terminal of the fifth resistor 352 and the sixth resistor 362, and the collector electrode 316 of the eighth transistor 312 and the base electrode 324 of the ninth transistor 322 are connected to each other.

With regard to the temperature signal processing circuit 110 and the PWM signal processing circuit 120 in FIG. 3, when the PWM signal has a low electric level, the eighth transistor 312 is turned off such that the voltage at the base electrode 324 of the ninth transistor 322 can become high which consequently can turn on the ninth transistor 322. In this situation, the current difference between the fifth transistor 252 and 123 can flow through the ninth transistor 322 to the second capacitor 392 and charge the second capacitor 392. When the PWM signal has a high electric level, the eighth transistor 312 is turned on, such that the voltage at the base electrode 324 of the ninth transistor 322 can become low which can turn off the ninth transistor 322. In this situation, the second capacitor 392 discharges electricity via the eighth resistor 382, and as a result, the voltage at the two terminals of the second capacitor 392 can change following the PWM input signal changes. In the meantime, the current I22 from the temperature signal processing circuit 110 can flow to the second capacitor 392, which can cause the voltage at the two terminals of the second capacitor 392 to change following the currents I22 changes.

Under the assumption that the duty cycle of the PWM input signal is d, the resistance value of the seventh resistor 372 is much larger than the resistance value of the eighth resistor 382, and the current that passes through the sixth resistor 362 is much smaller than the current that passes through the fifth resistor 352, the voltage at the second capacitor 392 can be approximately expressed as:

$$Vcf = Vcc \times \frac{R8}{R7+R8} + I22 \times R8 + \left(\frac{Vcc}{R5} - I23\right) \times \frac{1-d}{C2} = \qquad \text{Eqn. (5)}$$

$$Vcc \times \frac{R8}{R7+R8} + \left[I21 - \left(Vref1 - Vref \times \frac{RT}{R1+RT}\right) \times gm\right] \times R$$

$$8 + \left[\frac{Vcc}{R5} - M\left(I21 - \left(Vref1 - Vref \frac{RT}{R1+RT}\right) \times gm\right)\right] \times$$

$$\frac{1-d}{C2};$$

where R5, R7, and R8 are the resistance values of the fifth resistor 352, the seventh resistor 372 and the eighth resistor 382, respectively. As indicated by Eqn. (5), since the resistance value RT of the temperature sensitive resistor 283 is linearly related to the environmental temperature, the direct current voltage signal Vcf from the PWM signal processing circuit 120 is related to both the duty cycle of the PWM input signal d and the environmental temperature.

Figure 4:
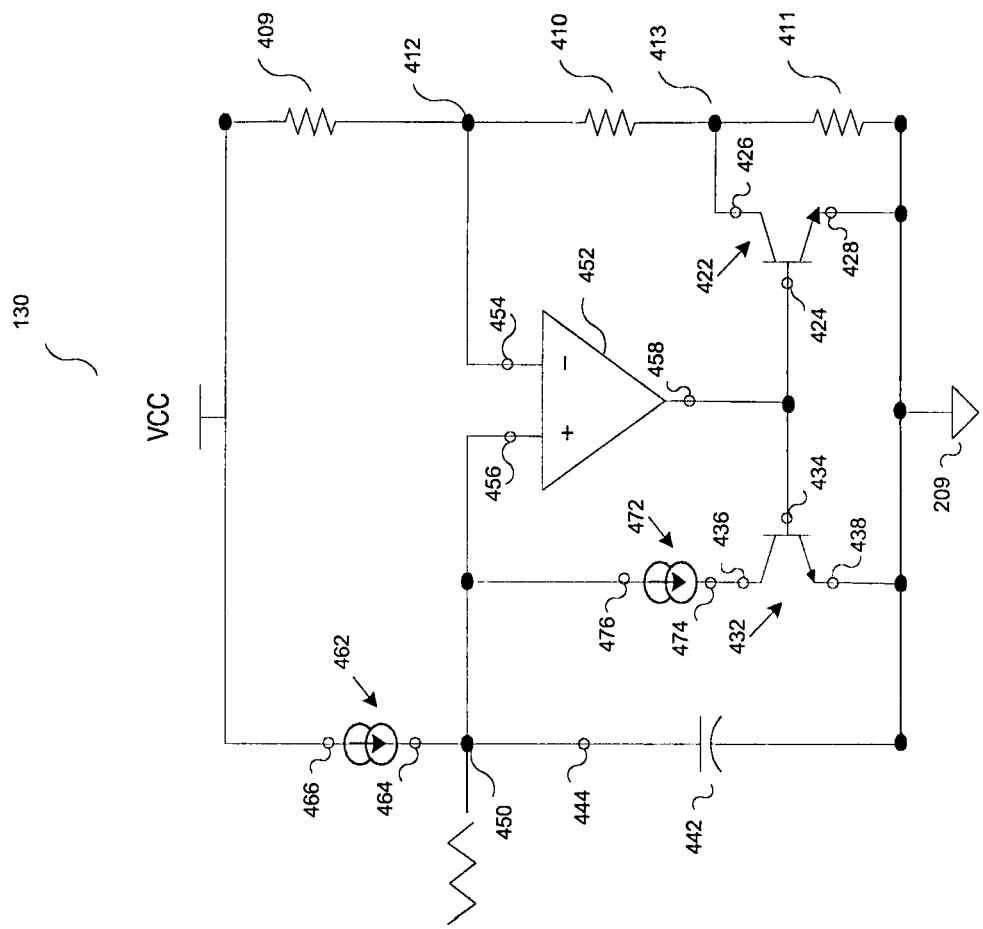
FIG. 4 is a circuit diagram showing a triangular wave generating circuit of FIG. 1.

FIG. 4 is a circuit diagram showing a triangular wave generating circuit 130 of FIG. 1, in accordance with the present invention.

As shown in FIG. 4, the triangular wave generating circuit 130 includes a ninth resistor 409, a tenth resistor 410, an eleventh resistor 411, a second comparator 452, a third current source 462, a fourth current source 472, a tenth transistor 422, an eleventh transistor 432, and a third capacitor 442.

In FIG. 4, one terminal of the ninth resistor 409 is connected to the power supply Vcc, and the other terminal is connected to the ground 209 through the tenth resistor 410 and the eleventh resistor 411. A shared terminal 412 of the ninth resistor 409 and the tenth resistor 410 is connected to a negative input terminal 454 of the second comparator 452. A shared terminal 413 of the tenth resistor 410 and the eleventh resistor 411 is connected to a collector electrode 426 of the tenth transistor 422. A base electrode 424 of the tenth transistor 422 and a base electrode 434 of the eleventh transistor 432 are short circuited. An emitter electrode 428 of the tenth transistor 422 and an emitter electrode 438 of the eleventh transistor 432 are connected to the ground 209. A positive terminal 466 of the third current source 462 is connected to the power supply Vcc. A negative terminal 464 of the third current source 462 is connected to both a positive terminal 476 the fourth current source 472 and a positive input terminal 456 of the second comparator 452. A negative terminal 474 of the fourth current source 472 is connected to a collector electrode 436 of the eleventh transistor 432. An output terminal of the second comparator 452 is connected to both a base electrode 424 of the tenth transistor 422 and a base electrode 434 of the eleventh transistor 432. The negative terminal 464 of the third current source 462 and a connector terminal 444 of the third capacitor 442 are an output terminal 450 of the triangular wave generating circuit 130 which can output a triangular signal.

It is important to note that the output current from the fourth current source 462 is twice as big as the output current from the third current source 472. A high voltage level and a low voltage level of the triangular signal output from the third capacitor 442 can be expressed as:

$$Vh = Vcc \times \frac{R10 + R11}{R9 + R10 + R11} \quad \text{Eqn. (6)}$$

$$Vl = Vcc \times \frac{R10}{R9 + R10};$$

where Vh is the high voltage level, Vl is the low voltage level, and R9, R10, R11 are the resistance values of the ninth resistor 409, the tenth resistor 410, and the eleventh resistor 411, respectively.

Figure 5:
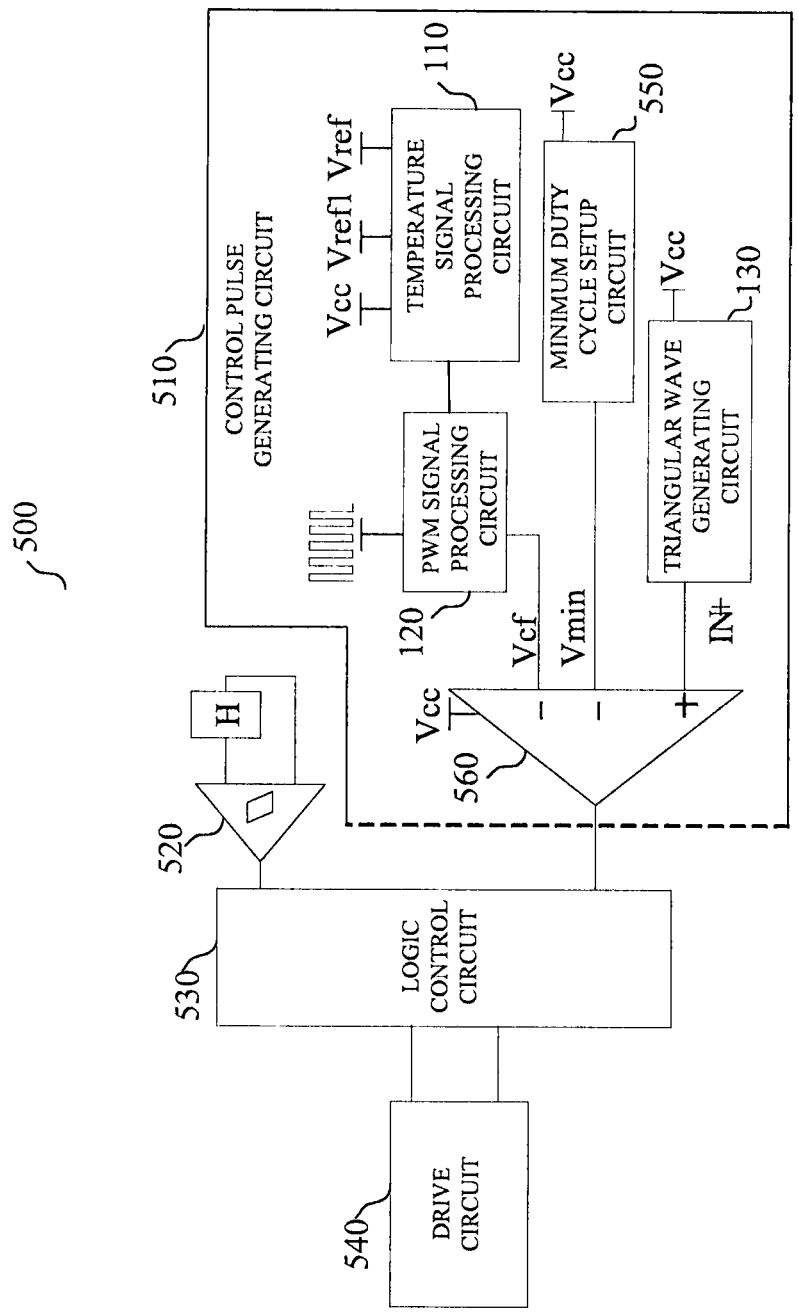
FIG. 5 is a circuit diagram showing a brushless motor control system that is configured to regulate rotation speed of a brushless direct current motor, in accordance with one configuration of the present invention.

FIG. 5 is a circuit diagram showing a brushless motor control system 500 which is configured to regulate rotation speed of a brushless direct current motor, in accordance with a second configuration of the present invention. The system 500 includes a control pulse generating circuit 510, a hall signal generating circuit 520, a logic control circuit 530, and a drive circuit 540. The control pulse generating circuit 510 includes a temperature signal processing circuit 110, a PWM signal processing circuit 120, a triangular wave generating circuit 130, a control pulse output circuit 560 and a minimum duty cycle setup circuit 550.

It is important to note that the difference between the system 500 and the system 100 shown in FIG. 1 lies in that the control pulse generating circuit 510 includes the minimum duty cycle setup circuit 550. The overall structure, functions and operation of the system 500 in FIG. 5 and the system 100 in FIG. 1 are essentially the same, and a description thereof similar components and function will be omitted.

In FIG. 5, the minimum duty cycle setup circuit 550 is used to generate a current voltage signal Vmin with minimum duty cycle setup, which can be output to a second negative input terminal of the control pulse output circuit 560. The control pulse output circuit 560 is used to compare the direct current signal Vcf, the current voltage signal with minimum duty cycle setup Vmin, and the triangular wave signal to generate a control pulse signal whose duty cycle has a linear relationship with both the duty cycle of the PWM input signal and the environmental temperature signal.

In the system 500, compared with they system 100, the minimum duty cycle setup circuit 550 is added to the control pulse generating circuit 510, which can provide a minimum duty cycle setup function in a cooling system driven by the brushless direct current motor. Assume the duty cycle of the PWM signal is d and the minimum duty cycle setup by the minimum duty cycle setup circuit 550 is Dm %, when d is smaller than Dm %, the rotation speed of the fan in the cooling system will be a constant value regardless of the environmental temperature.

Figure 6:
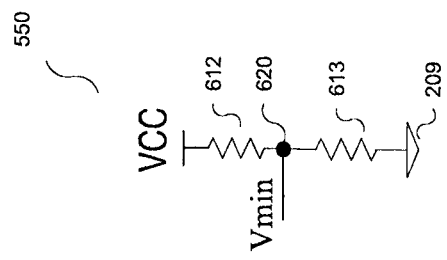
FIG. 6 is a circuit diagram showing a minimum duty cycle setup circuit of FIG. 5.

FIG. 6 is a circuit diagram showing a minimum duty cycle setup circuit 550 of FIG. 5, in accordance with a second configuration of the present invention. As shown in FIG. 6, the minimum duty cycle setup circuit 550 includes a twelfth resistor 612 and a thirteenth resistor 613. Two terminals of the twelfth resistor 612 are connected to the power supply Vcc and the ground through the thirteenth resistor 613, respectively. A shared terminal 620 of the twelfth resistor 612 and the thirteenth resistor 613 is an output terminal of the minimum duty cycle setup circuit 550, which can output the current voltage signal Vmin with minimum duty cycle setup.

In FIG. 6, the relationship between the current voltage signal with minimum duty cycle setup Vmin and the power supply Vcc can be expressed as:

$$Vmin = Vcc \times \frac{R13}{R12 + R13}; \quad \text{Eqn. (7)}$$

where R12 and R13 are the transistor values of the twelfth resistor 612 and the thirteenth resistor 613, respectively. The following condition has to be satisfied: Vl<Vmin<Vh, where Vh and Vl are the high electric level and low electric level of the triangular wave signal from the triangular wave generating circuit 130 respectively.

Figure 7:
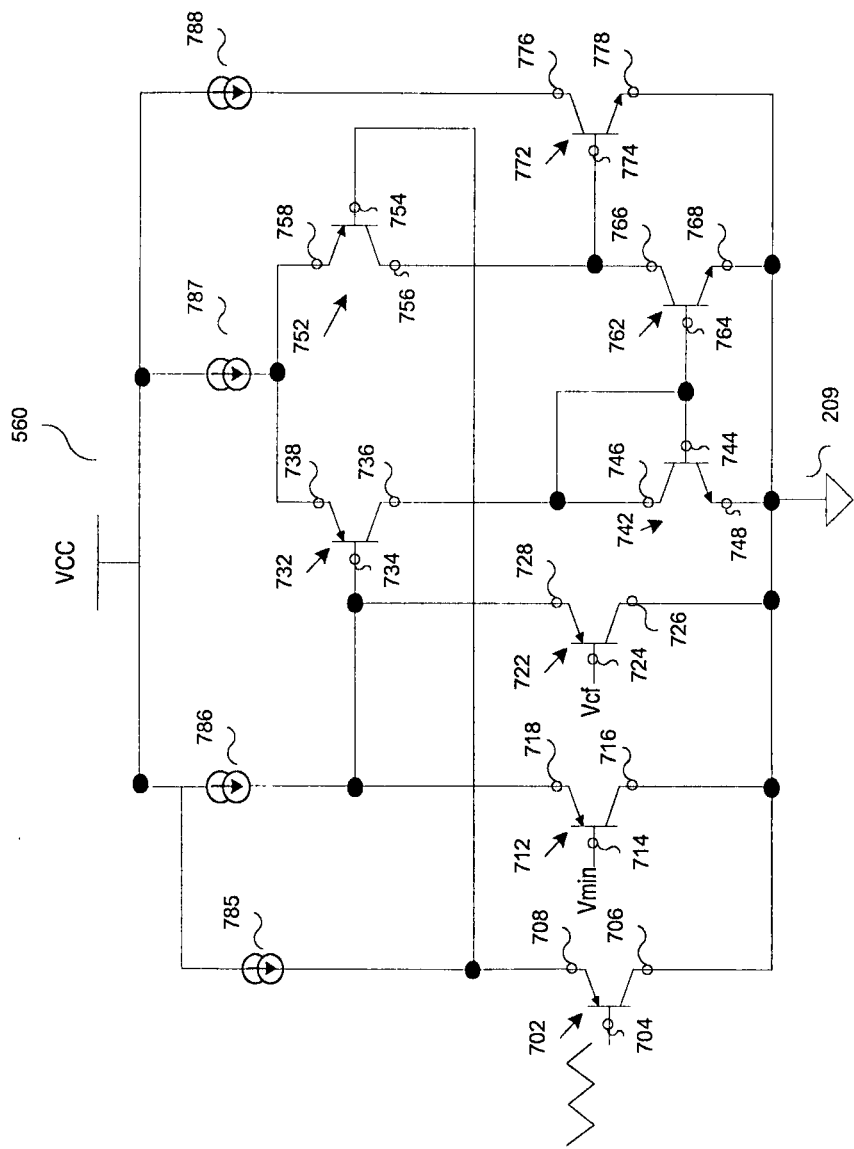
FIG. 7 is a circuit diagram showing a control pulse output circuit of FIG. 5.

FIG. 7 is a circuit diagram showing a control pulse output circuit 560 of FIG. 5, in accordance with the second configuration of the present invention. The control pulse output circuit 140 includes a twelfth transistor 702, a thirteenth transistor 712, a fourteenth transistor 722, a fifteenth transistor 732, a sixteenth transistor 742, a seventeenth transistor 752, an eighteenth transistor 762, a nineteenth transistor 772, a fifth current source 785, a sixth current source 786, a seventh current source 787, and an eighth current source 788.

As shown in FIG. 7, a positive terminal of the fifth current source 785, a positive terminal of the sixth current source 786, a positive terminal of the seventh current source 787, and a positive terminal of the eighth current source 788 are all connected to the power supply Vcc. A negative terminal of the fifth current source 785 is connected to an emitter electrode 708 of the twelfth transistor 702 and the base electrode 758 of the seventeenth transistor 752. A negative terminal of the sixth current source 786 is connected to an emitter electrode 718 of the thirteenth transistor 712, an emitter electrode 728 of the fourteenth transistor 722, and a base electrode 734 of the fifteenth transistor 732. A negative terminal of the seventh current source 787 is connected to an emitter electrode 738 of the fifteenth transistor 732 and the emitter electrode 758 of the seventeenth transistor 752. A negative terminal of the eighth current source 788 is connected to a collector electrode 776 of the nineteenth transistor 772. A collector electrode 736 of the fifteenth transistor 732 is connected to a collector electrode 746 of the sixteenth transistor 742. The collector electrode 746 of the sixteenth transistor 742 is short circuited to its base electrode 744, which is short circuited to a base electrode 764 of the eighteenth transistor 762. A collector electrode 766 of the eighteenth transistor 762 is connected to a collector electrode 756 of the seventeenth transistor 752 and a base electrode 774 of the nineteenth transistor 772. A emitter electrode 706 of the twelfth transistor 702, a emitter electrode 716 of the thirteenth transistor 712, a emitter electrode 726 of the fourteenth transistor 722, an emitter electrode 748 of the sixteenth transistor 742, an emitter electrode 768 of the eighteenth transistor 762, and an emitter electrode 778 of the nineteenth transistor 772 are all connected to the ground 209. A base electrode 704 of the twelfth transistor 702 is connected to a triangular wave signal which is output from the triangular wave generating circuit 130 as shown in FIG. 5. A base electrode 714 of the thirteenth transistor 712 is connected to the current voltage signal Vmin with minimum duty cycle setup from the minimum duty cycle setup circuit 550 as shown in FIG. 5. A base electrode 724 of the fourteenth transistor 722 is connected to the direct current voltage signal Vcf which is output from the PWM signal processing circuit 120 as shown in FIG. 5. A collector electrode 776 of the nineteenth transistor 772 is the output terminal of the control pulse processing circuit 560, which can generate a control pulse signal whose duty cycle has a near linear relation with both the duty cycle of the PWM input signal and the environmental temperature signal.

When the direct current voltage signal Vcf is higher than the voltage signal of minimum duty cycle setup Vmin, Vcf>Vmin, the duty cycle of control pulse signal is determined by the voltage signal of minimum duty cycle setup Vmin and the triangular wave signal. In this situation, the minimum duty cycle Dm can be expressed as:

$$Dm = \frac{Vh - V\min}{Vh - Vl} = \frac{\frac{R10+R11}{R9+R10+R11} - \frac{R13}{R12+R13}}{\frac{R10+R11}{R9+R10+R11} - \frac{R10}{R9+R10}}. \quad \text{Eqn. (8)}$$

When the direct current voltage signal Vcf is smaller than the voltage signal of minimum duty cycle setup Vmin, Vcf<Vmin, the duty cycle of control pulse signal is determined by the direct current voltage signal Vcf and the triangular wave signal. In this situation, the duty cycle D of the control pulse signal is:

$$D = \frac{Vh - Vcf}{Vh - Vl} = \quad \text{Eqn. (9)}$$

$$\frac{Vh - \left\{ \begin{array}{l} Vcc \times \frac{R8}{R7+R8} + \\ \left[ I21 - \left( Vref1 - Vref \times \frac{RT}{R1+RT} \right) \times gm \right] \times \\ R8 + \left[ \frac{Vcc}{R5} - M \left( I21 - \right. \right. \\ \left. \left. \left( Vref1 - Vref \frac{RT}{R1+RT} \right) \times gm \right) \right] \times \frac{1-d}{C2} \end{array} \right\}}{(Vh - Vl)}.$$

Therefore it can be seen that the duty cycle of the control pulse signal from the control pulse output circuit 560 is related to both the duty cycle of the PWM input signal and the environmental temperature.

In the following description, two temperature thresholds will be introduced: a first temperature threshold T1, a second temperature threshold T2, T1<T2. Assume, when environmental temperature T is equal or lower than the first temperature threshold T1, T≤T1, the first reference voltage Vref and the second reference voltage Vref1 can be set as $$Vref1 - Vref \times \frac{RT}{R1+RT} = 0;$$

and when the environmental temperature T is equal or higher than the second temperature threshold T2, T≥T2, the first reference voltage Vref and the second reference voltage Vref1 can be set as $$I21 - \left( Vref1 - Vref \times \frac{RT}{R1+RT} \right) \times gm = 0.$$

As shown in FIG. 5, a triangular voltage wave signal at the positive input terminal of the control pulse output circuit 560, which is the output signal from the triangular wave generating circuit 130, has a maximum voltage Vh and a minimum voltage Vl; Vcf is a direct current voltage signal at a negative input terminal of the control pulse output circuit 560, which is the output signal from the PWM signal processing circuit 120; and a direct current voltage signal with minimum duty cycle setup Vmin at another negative input terminal of the control pulse output circuit 560, is the output signal from the minimum duty cycle setup circuit 550.

When the environmental temperature T is lower than the first temperature threshold T1, T≤T1, the first reference voltage Vref and the second voltage Vref1 are set as $$Vref1 - Vref \times \frac{RT}{R1+RT} = 0.$$

In this situation, the duty cycle of the control pulse signal is:

$$D|_{T \leq T1} = \frac{Vh - \left[ Vcc \times \frac{R8}{R7+R8} + \frac{I21 \times R8 + \left( \frac{Vcc}{R5} - M \times I21 \right) \times \frac{1-d}{C2}}{} \right]}{Vh - Vl}. \quad \text{Eqn. (10)}$$

Therefore, when the environmental temperature T is lower than or equals T1, the duty cycle D of the control pulse signal is related to the duty cycle d of the PWM input signal, and is not related to the environmental temperature T.

When the environmental temperature T is higher than the second temperature threshold T2, T≥T2, the first reference voltage Vref and the second voltage Vref1 are set as $$I21 - \left( Vref1 - Vref \times \frac{RT}{R1+RT} \right) \times gm = 0.$$

In this situation, the duty cycle of the control pulse signal D is:

$$D|_{T \leq T2} = \frac{Vh - \left[ Vcc \times \frac{R8}{R7+R8} + \frac{Vcc}{R5} \times \frac{1-d}{C2} \right]}{Vh - Vl}. \quad \text{Eqn. (11)}$$

Therefore, when the environmental temperature T is higher than T2, the duty cycle D of the control pulse signal is related to the duty cycle d of the PWM input signal, and is not related to the environmental temperature T.

When the environmental temperature T is higher than T1 and lower than T2, $T_1<T<T_2$, the duty cycle D of the control pulse signal can be calculated by Eqn. (9), which is $$D|_{T_1<T<T_2} = \quad \text{Eqn. (12)}$$

$$\frac{Vh - \left\{ \begin{array}{l} Vcc \times \frac{R8}{R7+R8} + \\ \left[ I21 - \left( Vref1 - Vref \times \frac{RT}{R1+RT} \right) \times gm \right] \times \\ R8 + \left[ \frac{Vcc}{R5} - M \left( I21 - \right. \right. \\ \left. \left. \left( Vref1 - Vref \frac{RT}{R1+RT} \right) \times gm \right) \right] \times \frac{1-d}{C2} \end{array} \right\}}{Vh - Vl}.$$

Therefore, when the environmental temperature T is higher than T1 and lower than T2, the duty cycle D of the control pulse signal has a near linear relationship with both the environmental temperature and the duty cycle d of the PWM input signal.

Figure 8:
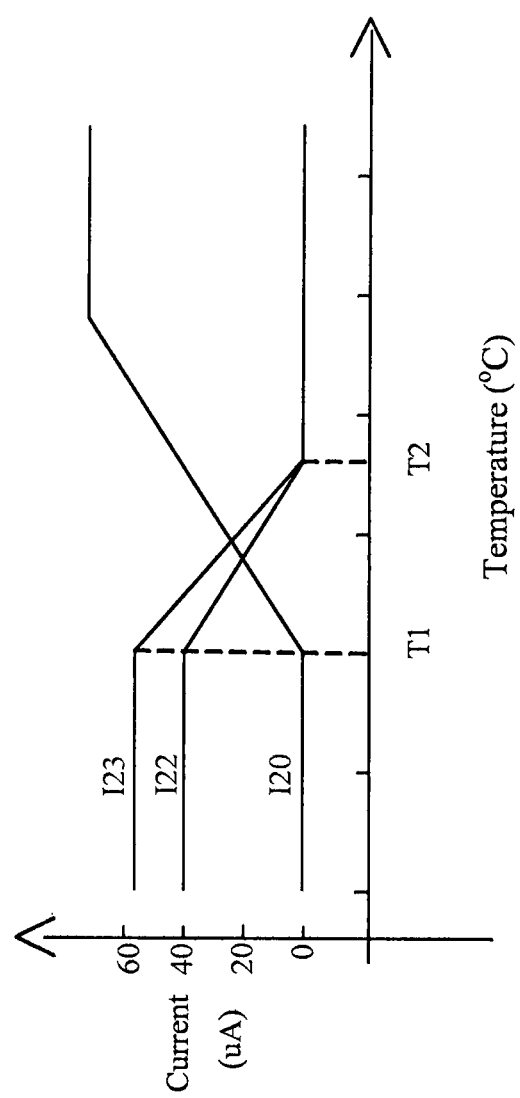
FIG. 8 is a graph illustrating relationships between the environmental temperature and the currentI22, the currentI23, and the current I20 of FIG. 2.

FIG. 8 is a graphic chart showing relationships between the environmental temperature and the current I20, the current I22, and the current I23 of FIG. 2. FIG. 8 can be drawn according to Eqn. (2), Eqn. (3) and Eqn. (4).

Figure 9:
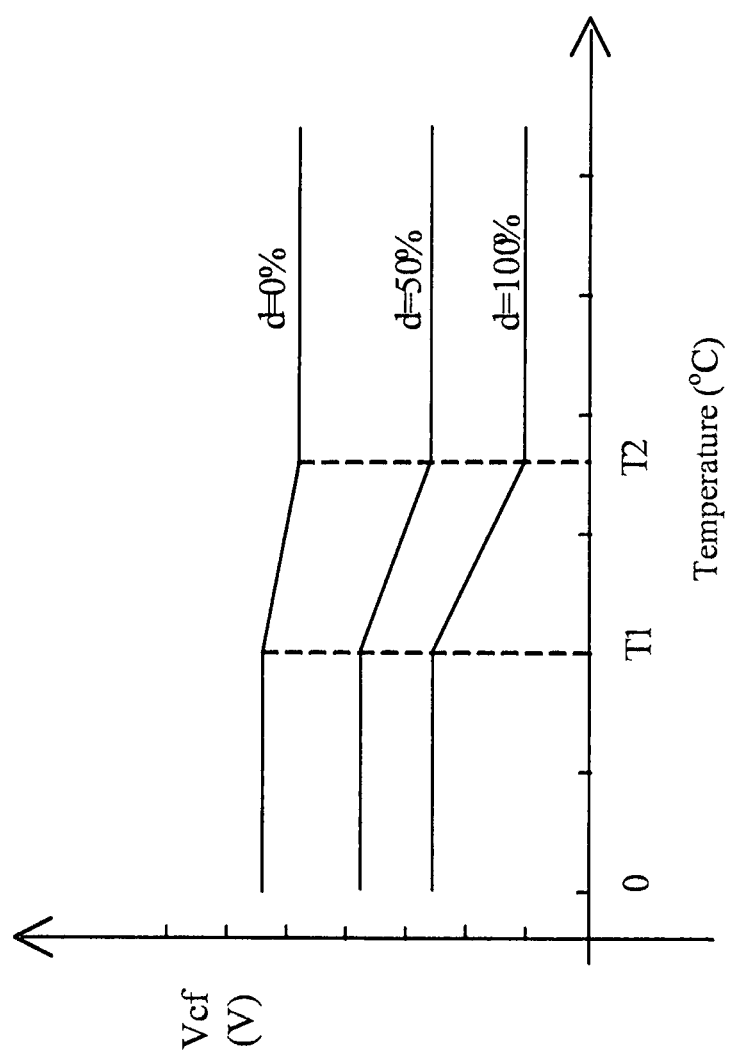
FIG. 9 is a graph illustrating the relationship between the direct current voltage signal Vcf, the duty cycle d of the PWM input signal and the environmental temperature based on the circuit of FIG. 3.

FIG. 9 shows a graphic chart of the relationship between the direct current voltage signal Vcf, the duty cycle d of the PWM input signal and the environmental temperature of FIG. 3. FIG. 9 can be drawn according to Eqn. (5).

Figure 10:
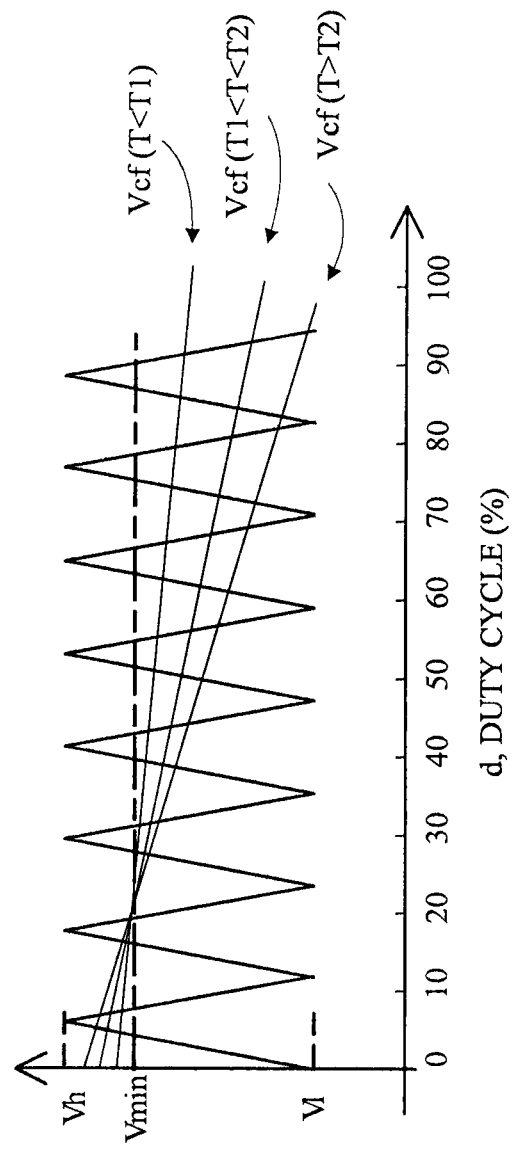
FIG. 10 is a graph illustrating the relationship between the direct current voltage signal Vcf, the triangular input signal, the duty cycle d of the PWM input signal and the environmental temperature based on the circuit of FIG. 5.

FIG. 10 shows a graphic chart of the relationship between the direct current voltage signal Vcf, the triangular input signal, the duty cycle d of the PWM input signal and the environmental temperature of FIG. 5. FIG. 9 can be drawn according to Eqn. (5). Vmin can be calculated by Eqn. (7).

Figure 11:
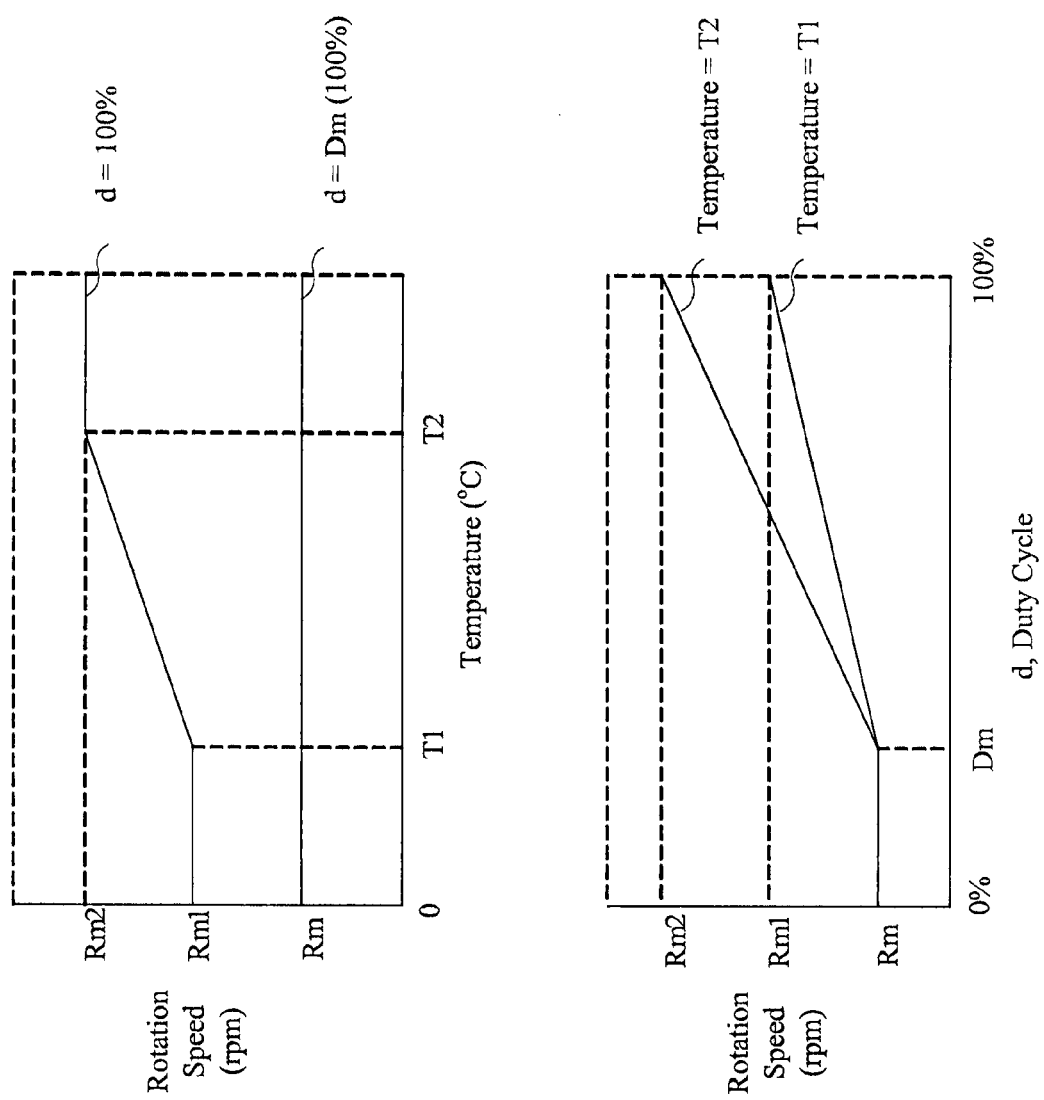
FIG. 11 is a graph illustrating relationships between the environmental temperature, rotation speed of the brushless direct current motor, and the duty cycle d of the PWM input signal, in accordance with the present invention.

FIG. 11 is a graphic chart showing relationships between the environmental temperature, rotation speed of the brushless direct current motor, and t the duty cycle d of the PWM input signal, in accordance with the present invention.

More specifically, for example, as shown in FIG. 1, the control pulse signal generated by the control pulse output circuit 140 in FIG. 1 is used to control the rotation speed of the motor. The logic control circuit 30 in FIG. 1 can output the control pulse signal to various bridge circuits of the driver circuit 40, based on the directional control signal generated by the Hall signal generation circuit 10 for controlling the direction of the coil current, and can control the direction of the current in the coils of the motor and the average load of the current based on the duty cycle of the control pulse signal so as to control the rotation speed of the motor.

It is important to note that the higher the duty cycle D of the control pulse signal, the faster the rotation speed of the motor; the lower the duty cycle of the control pulse signal, the slower the rotation speed of the motor.

When the environmental temperature is lower than T1, and the duty cycle d of the PWM input signal is higher than the set minimum duty cycle D$_m$, the duty cycle D of the control pulse signal only has a linear relationship with the duty cycle of the PWM input signal, as in Eqn. (10) Therefore, the rotation speed of the motor is also only linearly related to the duty cycle of the PWM input signal and is not related with the environmental temperature. As shown in FIG. 11(*a*), the rotational speed of the motor increases from Rm to Rm1 regardless of the temperature.

When the environmental temperature is higher than T1 but lower than T2, and the duty cycle d of the PWM input signal is higher than the set minimum duty cycle D$_m$, the duty cycle D of the control pulse signal has a near linear relationship with both the environmental temperature and the duty cycle of the PWM input signal, as in Eqn. (12). Therefore, the rotation speed of the motor has a near linear relationship with both the environmental temperature and the duty cycle of the PWM input signal. As shown in FIG. 11(*a*), when the input duty cycle is higher than Dm %, the rotational speed of the motor can change as temperature and the input duty cycle change. More specifically, in FIG. 11(*a*), when the input duty cycle is constant, the rotational speed of the motor will increase as the temperature increases; and vice versa. As shown in FIG. 11(*b*), when the temperature is constant, the rotational speed of the motor can increase as the input duty cycle increases.

When the environmental temperature is higher than T2, and the duty cycle d of the PWM input signal is higher than the set minimum duty cycle D$_m$, the duty cycle D of the control pulse signal only has a linear relationship with the duty cycle of the PWM input signal, as in Eqn. (11). Therefore, the rotation speed of the motor is also only linearly related to the duty cycle of the PWM input signal and is not related with the environmental temperature. As shown in FIG. 11 (*a*), the rotational speed can increase when the input duty cycle increases and it is not related with the temperature. When the input duty cycle is 100%, the rotational speed reaches its maximum rate of Rm2.

As shown in FIG. 11(*b*), when the duty cycle d of the PWM input signal is lower than the set minimum duty cycle D$_m$, the duty cycle of the control pulse signal is determined by the minimum duty cycle setup circuit 550. It does not change as the environmental temperature and the duty cycle of the PWM input signal change. The rotation speed of the motor keeps the same. This indicate that system 500 has the ability to set up a minimal duty cycle D$_m$. When the duty cycle d of the PWM input signal is smaller than Dm, regardless the level of the temperature, the rotational speed of the cooling fan is a constant Rm.

Figure 12:
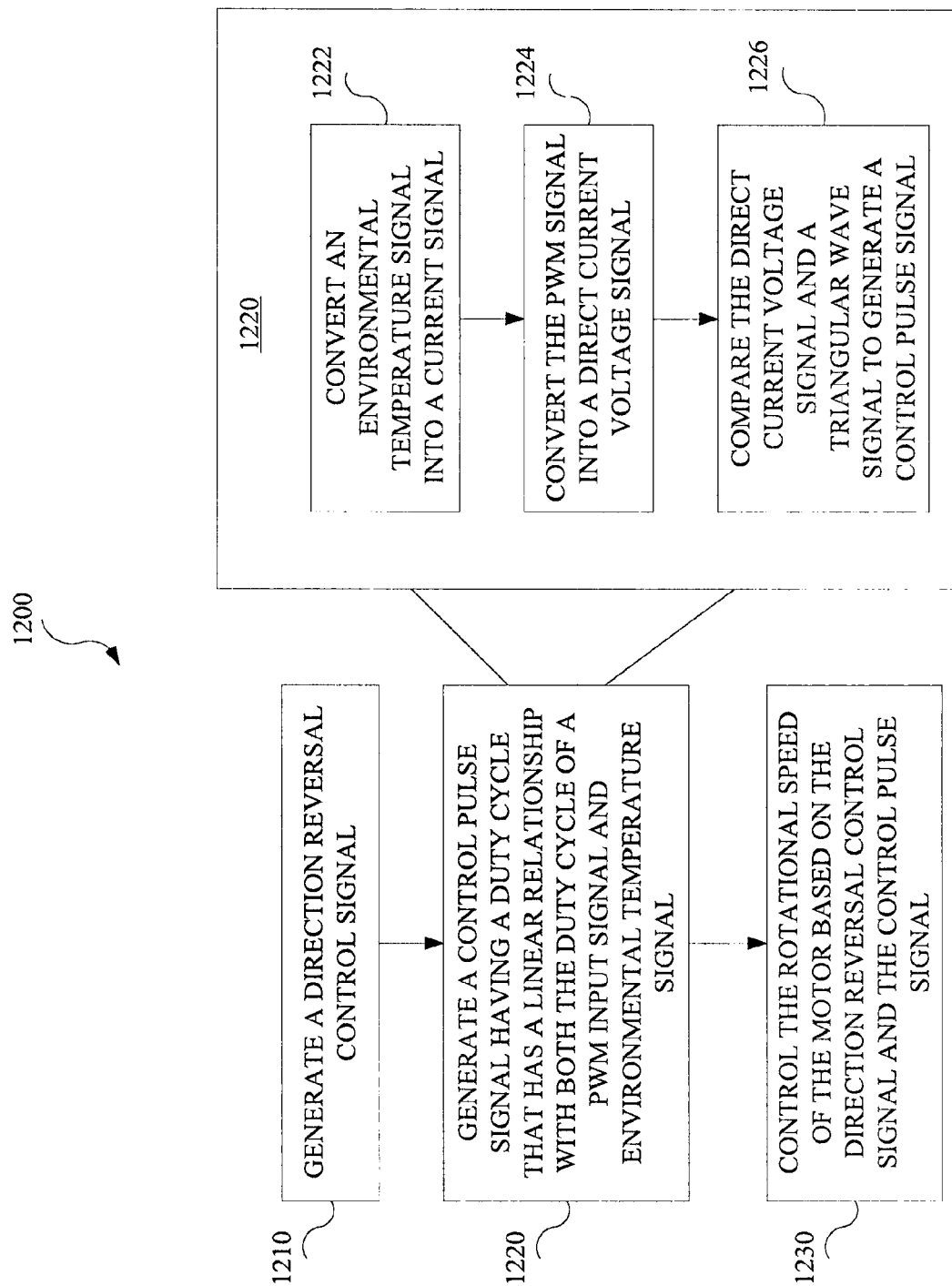
FIG. 12 is a flow chart setting forth the steps of a process for regulating the rotation speed of a brushless direct current motor, in accordance with the present invention.

FIG. 12 is a flow chart showing the process of the method 1200 of regulating the rotation speed of a brushless direct current motor, in accordance with present invention. In block 1210, the method 1200 can generate a direction reversal control signal when the north and south poles of the generator rotor pass through a hall component. In block 1220, the method 1200 can generate a control pulse signal whose duty cycle has a linear relationship with both the duty cycle of a PWM input signal and an environmental temperature signal. In block 1230, the method 1200 can regulate and control the rotation speed of a brushless direct current motor by using the direction reversal control signal from the block 1210 and the control pulse signal from the block 1220. Further, using the control pulse signal in block 1230 enables the method 1200 to regulate and control the rotation speed of the brushless direct current motor by using both environmental temperature and PWM signals simultaneously.

More specifically, block 1220 include the following steps. In block 1222, method 1220 can convert the environmental temperature signal that has been detected into a current signal that has a near linear relation with the environmental temperature signal. In block 1224, method 1220 can, based on the current signal, convert the PWN signal into a direct current voltage signal that has a near linear relationship with the duty cycle of the PWM input signal and the environmental temperature signal. In block 1226, method 1220 can compare the direct current voltage signal and a triangular wave signal to generate the control pulse signal whose duty cycle has a linear relationship with both the duty cycle of the PWM input signal and the environmental temperature signal.

More specifically, in this example, a temperature sensitive device is used to convert the environmental temperature that has been detected to current signals which will affect the magnitude of the direct current voltage signal within a certain range of temperatures. Then the direct current voltage signal is compared with the triangular wave signal to generate a control pulse generating circuit whose duty cycle has a linear relationship with both the duty cycle of the PWM input signal and the environmental temperature signal. The control pulse signal is used to regulate the rotation speed of the motor so that the environmental temperature and the PWM input signal are used at the same time to control the rotation speed of the motor.

Detailed description is provided above for a motor control system provided by the present invention. Embodiments are used herein to describe the principles and modes of carrying out the present invention, the above description of embodiments is only to help understand the methods and core thinking of the present invention; at the same time, those skilled in the art may modify modes of carrying out and application scope of the present invention according to the spirit thereof.

In summary, the contents of the specification may not be construed as restrictive to the present invention.

The present invention provides a motor control system configured to regulate a motor rotation speed. When the duty cycle of a PWM signal is smaller than a minimum duty cycle, regardless the level of the temperature, the motor rotation speed is a constant; when the temperature is below a first temperature threshold and duty cycle of the PWM signal is higher than the minimum duty cycle, the motor rotation speed increases as the duty cycle of the PWM signal increases and vice versa; when the temperature is above the first temperature threshold and below a second temperature threshold, and the duty cycle of the PWM signal is higher than the minimum duty cycle, the motor rotation speed changes following the both the temperature change and the PWM signal duty cycle change; and when the temperature is above the second temperature threshold, the motor rotation speed changes only following the PWM signal duty cycle and the temperature does not affect the rotation speed.

What is claimed is:

1. A cooling system configured to control a temperature associated with an integrated circuit, the cooling system comprising:
    a brushless motor configured to drive a cooling device based on a rotational speed of the motor;
    a temperature monitoring input configured to receive an environmental temperature signal indicating a temperature associated with an integrated circuit;
    a clock input configured to receive a clock signal having a predetermined duty cycle;
    a motor controller configured to receive the environmental temperature signal from the temperature monitoring input and the clock signal from the clock input and coupled to the brushless motor to control the rotational speed of the motor using at least a speed control method by:
        comparing the environmental temperature signal to a predetermined threshold T1 and T2;
        if the environmental temperature signal is less than the predetermined threshold T1 or higher than T2, controlling the rotational speed of the motor using the speed control method and only the clock signal; and
        if the environmental temperature signal is greater than the predetermined threshold T1 and less than T2, controlling the rotational speed of the motor using the speed control method and both of the environmental temperature signal and the clock signal;
    wherein the motor controller includes a pulse generating circuit comprising:
        a temperature signal processing circuit configured to receive the environmental temperature signal, and output an electric current signal, wherein the electric current signal has a relationship with the environmental temperature signal;
        a clock signal processing circuit configured to receive the clock signal and the electric current signal and generate a direct current voltage signal;
        a triangular wave generating circuit configured to generate a triangular wave signal; and
        a control pulse output circuit configured to process the triangular wave signal and the direct current voltage signal, and deliver a control pulse signal to control the rotational speed of the brushless motor,
        wherein the direct current voltage signal has a relationship with both the environmental temperature signal and the clock signal, such that the duty cycle of the pulse control signal has a relationship with both the environmental temperature signal and the duty cycle of the clock signal when the environmental temperature signal is greater than the predetermined threshold T1 and less than T2; and
    wherein the motor controller further comprises:
    a minimum duty cycle setup circuit configured to generate a minimum voltage signal that is output to the control pulse output circuit, wherein the minimum voltage signal is compared with the direct current voltage signal, to determine the duty cycle of the control pulse signal,
    wherein when the voltage of the direct current voltage signal is above the voltage of the minimum voltage signal, the duty cycle of the control pulse signal is determined by the triangular signal and the minimum voltage signal, as $$Dm = \frac{Vh - V\min}{Vh - Vl},$$

wherein Dm is a minimum duty cycle of the control pulse signal, Vh, Vl represents a high and low voltage of the triangular signal, and Vmin is the voltage of the minimum voltage signal;
    wherein, when the voltage of the direct current voltage signal is below the voltage of the minimum voltage signal, the duty cycle of the control pulse signal is determined by the triangular signal and the direct current voltage signal, as $$D = \frac{Vh - Vcf}{Vh - Vl},$$

wherein D is a duty cycle of the control pulse signal and Vcf is the voltage of the direct current voltage signal.

2. The cooling system of claim 1, wherein when the duty cycle of the input clock signals is smaller than a minimum duty cycle, the motor rotation speed is a constant.

3. The cooling system of claim 1, wherein, when the duty cycle of the control pulse is greater than a minimum duty cycle and when the environmental temperature signal is not in a range between the predetermined temperature threshold and another temperature threshold, the motor rotation speed has a relationship with the duty cycle of the clock signal.

4. A control pulse generating circuit configured to generate a control pulse signal which is used to regulate a motor rotation speed, comprising:
    a temperature signal processing circuit, configured to receive an environmental temperature signal, and output an electric current signal, wherein the electric current signal has a relationship with the environmental temperature signal;
    a pulse signal processing circuit configured to receive the electric current signal and an input pulse signal, and generate a direct current voltage signal, wherein under certain circumstance, the direct current voltage signal has a relationship with both the environmental temperature signal and the duty cycle of the input pulse signal;
    a triangular wave generating circuit configured to generate a triangular wave signal; and
    a control pulse output circuit configured to process the triangular wave signal and the direct current voltage signal, and output a pulse control signal, which, under a first set of conditions, has a near linear relationship with both the environmental temperature signal and the duty cycle of the input pulse signal, and under a second set of conditions, has a relationship with only the duty cycle of the input pulse signal and not the environmental temperature signal.

5. A control pulse generating circuit of claim 4 wherein the certain circumstance includes when temperature is above a first temperature threshold and below a second temperature threshold, and the duty cycle of the input pulse signal is higher than a minimum duty cycle.

6. The control pulse generating circuit of claim 4, wherein the temperature signal processing circuit comprises:
   a first transistor and a second transistor having a common base electrode connection connected to a collector electrode of the first transistor and a base electrode of a third transistor;
   a third transistor having a base electrode connected to the common base electrode connection of the first transistor and the second transistor;
   a fourth transistor and a fifth transistor having a common base electrode connection connected to a collector electrode of the second transistor and a collector electrode of the fifth transistor, and having a common emitter electrode connection connected to a power supply;
   a sixth transistor having a collector electrode connected to the collector electrode of the first transistor, and a seventh transistor having a common base electrode with the sixth transistor, the collector electrode and base electrode of the seventh transistor are short circuited.
   a first electric current source connecting between the power supply and the collector electrode of the first transistor.
   a comparator having a positive input terminal connected to a second reference voltage, and having an output terminal connected to a collector electrode of the seventh transistor;
   a first resistor connected between a first reference voltage and a negative input terminal of the comparator; and
   a temperature sensitive resistor connected between the negative input terminal of the comparator and ground,
   wherein the emitter electrodes of the first transistor, the second transistor, the third transistor, the sixth transistor, and the seventh transistor are connected to ground.

7. The control pulse generating circuit of claim 4 wherein a collector electrode of the fourth transistor is a first terminal which outputs a first electric current signal, and a collector electrode of the third transistor is a second terminal which outputs a second electric current signal.

8. The control pulse generating circuit of claim 4, wherein the pulse signal processing circuit comprises:
   an eighth transistor having a base electrode configured to receive an input pulse signal, and having an emitter electrode connected to ground;
   a ninth transistor having a base electrode and a collector electrode both connected to a collector electrode of the eight transistor, and having an emitter electrode connected to a direct current voltage;
   a third resistor connected between a power supply and the base electrode of the eighth transistor;
   a fourth resistor connected between the base electrode of the eighth transistor and ground;
   a fifth resistor connected between the power supply and the base electrode of the ninth transistor;
   a sixth resistor connected between the base electrode of the ninth transistor and ground;
   a seventh resistor connected between the power supply and the emitter electrode of the ninth transistor;
   an eighth resistor connected between the emitter electrode of the ninth transistor voltage and ground; and
   a capacitor connected between the direct current voltage and ground.

9. The control pulse generating circuit of claim 8 wherein the emitter electrode and the base electrode of the ninth transistor is connected to the first terminal and the second terminal of the temperature signal processing circuit, respectively.

10. The control pulse generating circuit of claim 8 wherein the emitter electrode of the ninth transistor is an output terminal which outputs a direct current voltage signal.

11. The control pulse generating circuit of claim 4, wherein the triangular wave generating circuit comprises:
   a second comparator;
   a tenth transistor and an eleventh transistor having a common base electrode connection connected to an output terminal of the second comparator, and having a common emitter electrode connection connected to ground;
   a third current source having a positive terminal connected to the power supply;
   a fourth current source having a negative terminal connected to a collector electrode of the eleventh transistor, wherein a positive terminal of the fourth current source and a negative terminal of the third current source having a common connection connected to a positive input terminal of the second comparator;
   a third capacitor connected between the negative terminal of the third current source and ground;
   a ninth resistor connected between the power supply and a negative terminal of the second comparator;
   a tenth resistor connected between the negative terminal of the second comparator and a collector electrode of the tenth transistor; and
   an eleventh resistor connected between the collector electrode of the tenth transistor and ground.

12. The control pulse generating circuit of claim 11 wherein the negative terminal of third current source is an output terminal which output a triangular wave signal.

13. The control pulse generating circuit of claim 4 further comprises a minimum duty cycle setup circuit comprising:
   a twelfth resistor connected between a power supply and an output terminal of the minimum duty cycle setup circuit;
   and a thirteenth resistor connected between the output terminal and ground,
   wherein the output terminal outputs a minimum duty cycle setup voltage signal, which is used to be compared with.

14. The control pulse generating circuit of claim 4 wherein the control pulse output circuit comprises:
   a fifth current source, a sixth current source, a seventh current source and an eight current source, having a common positive terminal connection connected to a power supply;
   a twelfth transistor having a collector electrode connected to ground and an emitter electrode connected to a negative terminal of the fifth current source;
   a thirteenth transistor having a collector electrode connected to ground and an emitter electrode connected to a negative terminal of the sixth current source;
   a fourteenth transistor having a collector electrode connected to ground and an emitter electrode connected to the emitter electrode of the thirteenth transistor;
   a fifteenth transistor having a base electrode connected to the emitter electrode of the fourteenth transistor and an emitter electrode connected to a negative terminal of the seventh current source;
   a sixteenth transistor having a common collector electrode connection with the fifteenth transistor, a base electrode are short circuited to collector electrode, an emitter electrode connected to ground;

a seventeenth transistor having an emitter electrode connected to the negative terminal of the seventh current source and a base electrode terminal connected to the emitter electrode of the twelfth transistor;

an eighteenth transistor having a common base electrode connection with the sixteenth transistor, a common collector electrode connection with the seventeenth transistor, and an emitter electrode connected to ground;

an nineteenth transistor having a base electrode connected to the common collector electrode connection of the seventeenth transistor and the eighteenth transistor, a collector electrode connected to a negative terminal of the eighth current source, and an emitter electrode connected to ground.

15. The control pulse output circuit of claim 14 wherein
a base electrode of the twelfth transistor receives an triangular wave signal which is output from the triangular wave generating circuit;

a base electrode of the thirteenth transistor receives an minimum duty cycle setup voltage signal from the minimum duty cycle setup circuit;

a base electrode of the fourteenth transistor receives a voltage signal from the pulse signal processing circuit; and the collector electrode of the nineteenth transistor outputs a control pulse signal having a duty cycle related to both the environmental temperature signal and the duty of the input pulse signal.

16. A method of regulating a rotational speed of a motor comprising:

generating a direction reversal control signal;

generating a control pulse signal, wherein the duty cycle of control pulse signal, under certain circumstance, has a relationship with both an environmental temperature signal and a duty cycle of an input pulse signal;

regulating motor rotation speed by using the direction reversal control signal and the control pulse signal, wherein the motor rotation speed, under a first set of conditions, has a near linear relationship with both the environmental temperature signal and the duty cycle of the input pulse signal, and under a second set of conditions, has a relationship with only the duty cycle of the input pulse signal and not the environmental temperature signal.

17. The method of claim 16 wherein the certain circumstance includes when temperature is above a first temperature threshold and below a second temperature threshold, and the duty cycle of the input pulse signal is higher than a minimum duty cycle.

18. The method of claim 16 wherein the environmental temperature signal is received by using a temperature sensitive resistor.

19. A method of generating a control pulse signal, wherein the control pulse signal, under certain circumstance, has a relationship with both an environmental temperature signal and a duty cycle of an input pulse signal, comprising:

receiving an environmental temperature signal and generating a direct current signal which has a relationship with the environmental temperature signal, wherein the environmental temperature signal is received by using a temperature sensitive resistor;

receiving an input pulse signal and the direct current signal, and generating a direct current voltage signal, which has a relationship with both the environmental temperature signal and the duty cycle of the input pulse signal; and receiving the direct current voltage signal and a triangular wave signal, and generating a control pulse signal, wherein the duty cycle of the control pulse signal, under a first set of conditions, has a near linear relationship with both the environmental temperature signal and the duty cycle of the input pulse signal, and under a second set of conditions, has a relationship with only the duty cycle of the input pulse signal and not the environmental temperature signal.

* * * * *